United States Patent [19]
Ukita et al.

[11] Patent Number: 5,650,978
[45] Date of Patent: Jul. 22, 1997

[54] SEMICONDUCTOR MEMORY DEVICE HAVING DATA TRANSITION DETECTING FUNCTION

[75] Inventors: Motomu Ukita; Tadato Yamagata; Yoshiyuki Haraguchi; Kunihiko Kozaru, all of Hyogo, Japan

[73] Assignee: Mitsubishi Denki Kabushiki Kaisha, Tokyo, Japan

[21] Appl. No.: 535,859

[22] Filed: Sep. 28, 1995

[30] Foreign Application Priority Data

Nov. 15, 1994  [JP]  Japan ................... 6-280255

[51] Int. Cl.$^6$ ................................................. G11C 11/34
[52] U.S. Cl. .............................. 365/233.5; 365/191
[58] Field of Search ............................ 365/233, 233.5, 365/203, 191

[56] References Cited

U.S. PATENT DOCUMENTS 4,751,680  6/1988  Wang et al. ........................ 365/233.5
4,962,487  10/1990  Suzuki ................................ 365/233.5

FOREIGN PATENT DOCUMENTS 1-251496  10/1989  Japan.

Primary Examiner—Joseph A. Popek
Attorney, Agent, or Firm—Lowe, Price, LeBlanc & Becker

[57] ABSTRACT

A static RAM includes: a memory cell array including word lines, bit line pairs and memory cells; a row recorder; a column decoder; a DTD signal generator responsive to transition of input data or transition of a write enable signal for generating a data transition detection signal for a prescribed time period; and a write driver responsive to the write enable signal and the data transition detection signal for supplying the input data to a bit line pair selected by the column decoder. Even when there is a noise in write enable signal during reading cycle and data transition detection signal is generated erroneously, erroneous writing of data can be prevented, since write enable signal is not supplied to the write driver.

8 Claims, 11 Drawing Sheets

303(306)

32

24

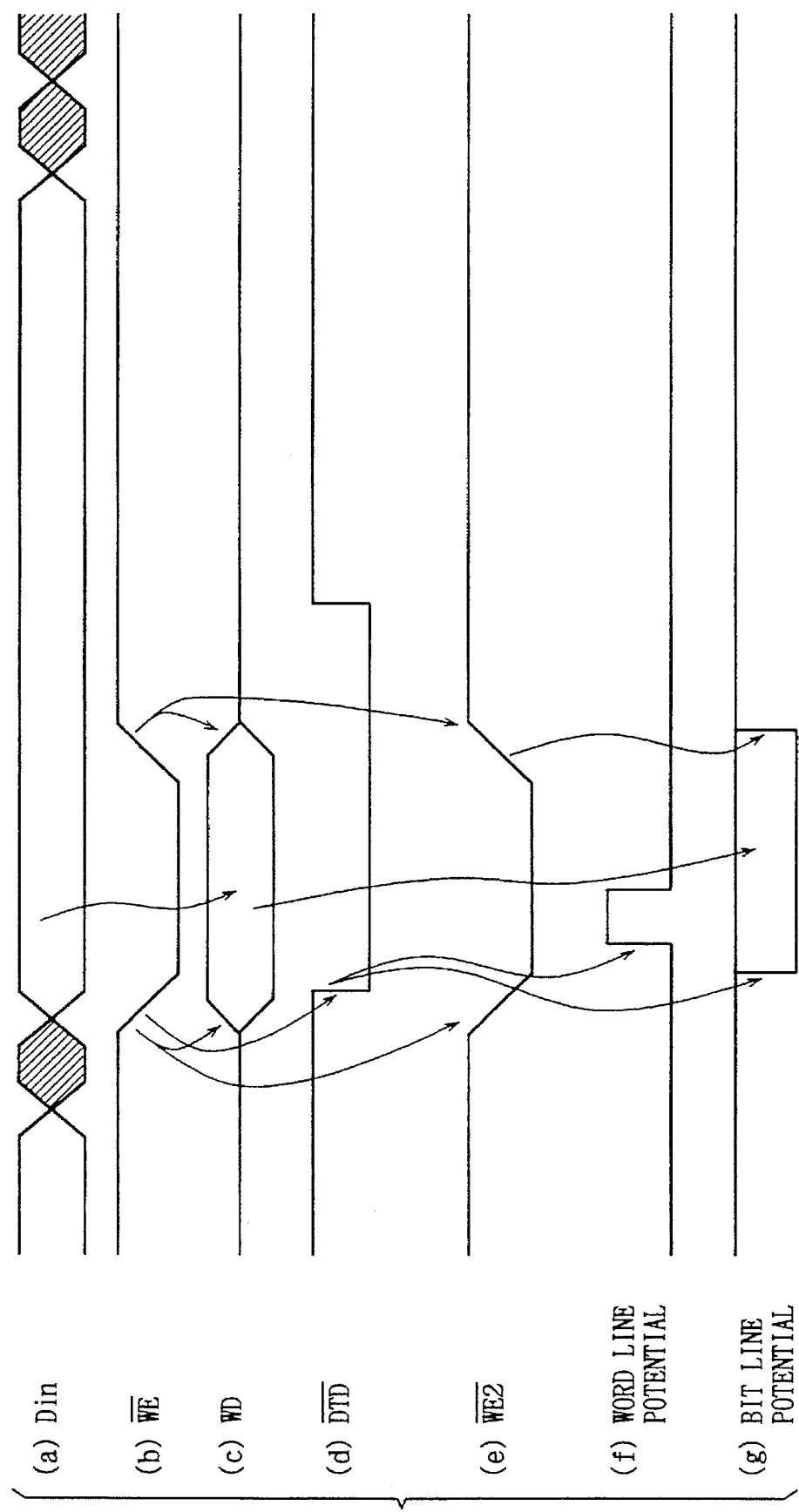

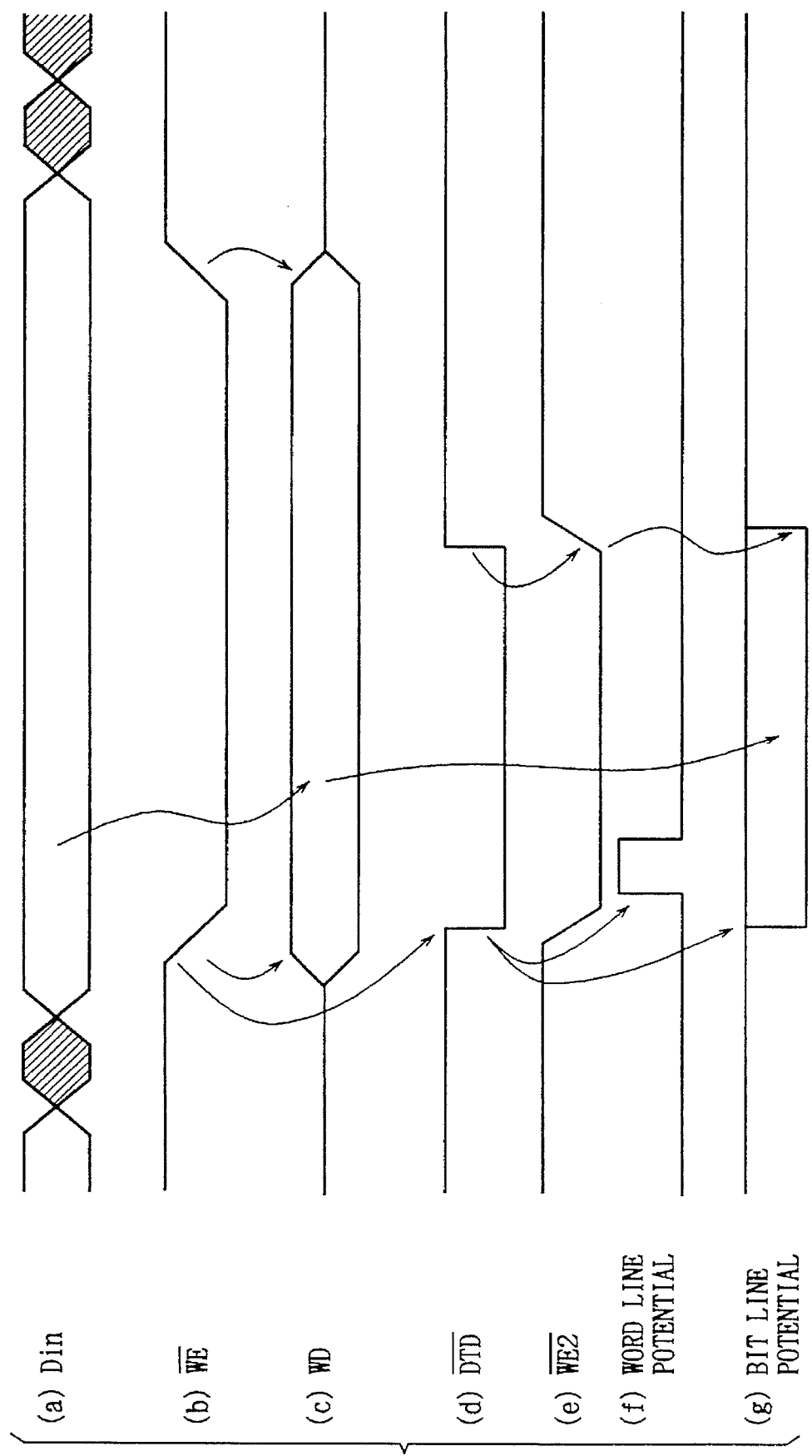

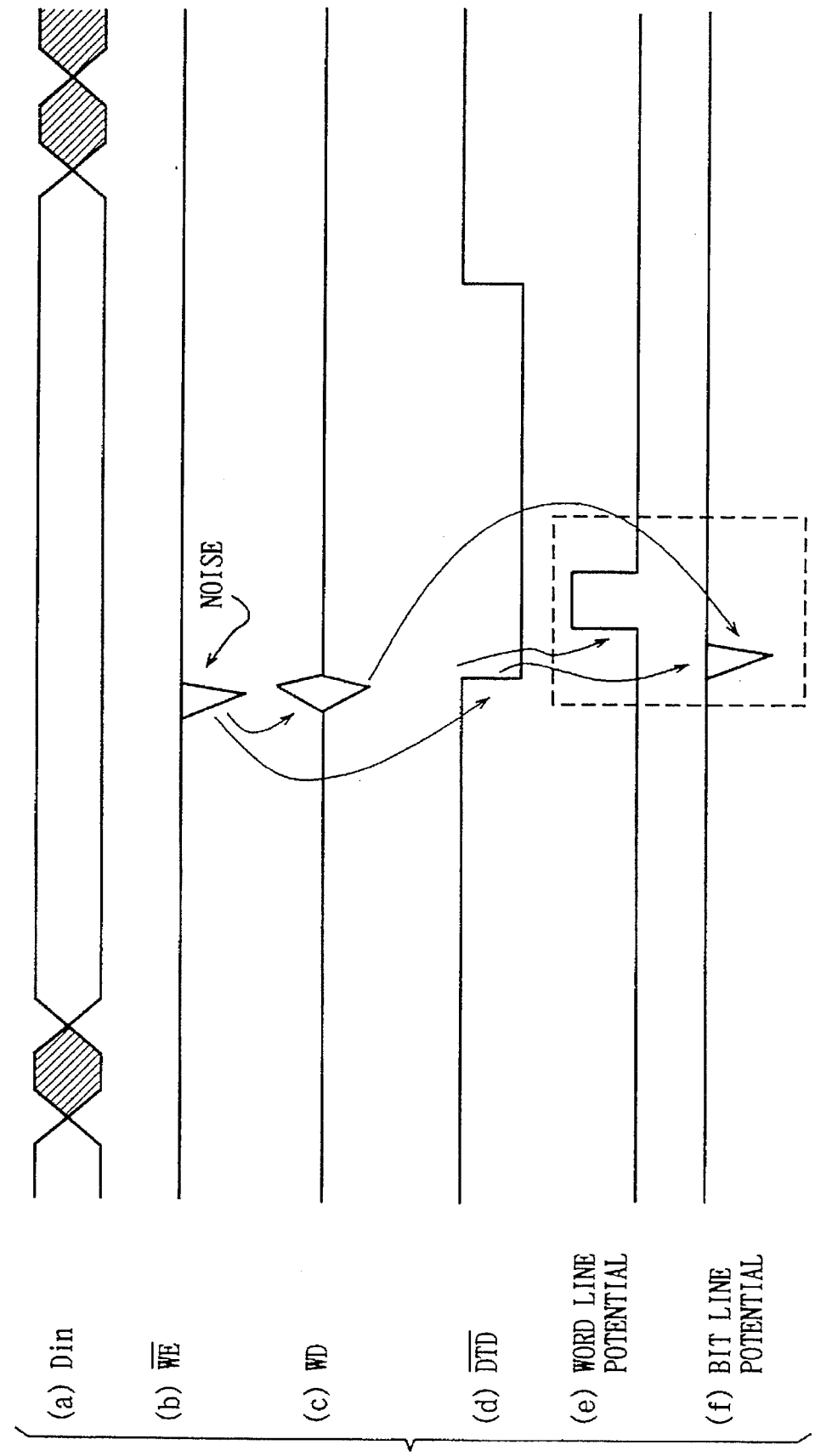

SEMICONDUCTOR MEMORY DEVICE HAVING DATA TRANSITION DETECTING FUNCTION

BACKGROUND OF THE INVENTION

Field of the Invention

The present invention relates a semiconductor memory device and, more specifically, a semiconductor memory device having data transition detector (DTD).

A static random access memory (SRAM) not requiring refreshing operation is one of volatile semiconductor memory devices. In the SRAM, input data is supplied to a write driver. The write driver is activated in response to an externally supplied write enable signal, and in write mode, writes the supplied input data to one selected memory cell. At this time, since write driver is neutralized during the write mode, it continues writing data even after the data has been written to the memory cell. Accordingly, a large amount of current for writing flows from a bit line load to the bit line, and large amount of operational current also flows to the write driver and sense amplifier and the like. Therefore, power consumption at the time of writing is considerable in the SRAM.

In order to reduce power consumption at the time of writing, an SRAM having a DTD has been proposed. An SRAM having the DTD is disclosed, for example, in Japanese Patent Laying Open No. 1-251496. The DTD generates, when input data changes, a data transition detecting signal for a prescribed time period. The DTD also generates the data transition detecting signal when write enable single changes from a read state to write state, for a prescribed time period. In the SRAM having the DTD, write driver is activated in response to the data transition detecting signal. Therefore, write driver writes the input data to the memory cell only for the prescribed time period from the change of the input data, and it does not continue writing of data after completion of writing. Therefore, the above described extra current does not flow, and power consumption can be reduced.

However, when there is a noise generated in the write enable signal, the DTD generates the data transition detecting signal in response to the noise. This leads to a problem that write driver is erroneously activated and data is written to a memory cell which has been selected for reading.

Thus, the SRAM having the DTD suffers from the problem of so-called erroneous writing, in which operation temporarily changes from the read state to the write state because of noise included in the write enable signal resulting in erroneous writing of data memory cell, though the SRAM is advantageous in view of reduced power consumption.

SUMMARY OF THE INVENTION

An object of the present invention is to provide a semiconductor memory device with small power consumption at the time of writing.

Another object of the present invention is to provide a semiconductor memory device in which erroneous writing is prevented.

According to one aspect of the present invention, the semiconductor memory device includes a memory cell, a signal generating circuit and a data writing circuit. The signal generating circuit generates, in response to a change of an externally applied input data or to an externally applied write control signal, a data transition detecting signal for a prescribed time period. The data writing circuit writes input data to the memory cell, when the write control signal and the data transition detecting signal are both supplied. Therefore, in response to the change in the externally applied input data or to the externally applied write control signal, data transition detecting signal is generated. When the write control signal and the data transition detecting signal are both supplied to the data writing circuit, input data is written to the memory cell. Therefore, even when there is a noise in the write control signal during reading operation and data transition detecting signal is generated, the write control signal is not supplied to the data writing circuit and therefore input data would never be erroneously written to the memory cell.

Preferably, the data writing circuit includes a control circuit and a write driver circuit. The control circuit generates a prescribed activating signal when the write control signal and the data transition detecting signal are both supplied. The write driver circuit amplifies and outputs the input data in response to the activating signal from the control circuit.

Therefore, when the write control signal and the data transition detecting signal are both supplied to the control circuit, a prescribed activating signal is supplied to the write driver circuit. In response to the activating signal, write driver circuit is activated, thus amplifying input data and the amplified input data is written to the memory cell. The signal generating circuit preferably includes first and second transition detecting circuits and a signal expansion circuit. The first transition detecting circuit detects a change in the input data and generates a first detection signal. The second transition detecting circuit detects a change in the write control signal and generates a second detection signal. When the first or second detection signal from the first or second transition detecting circuit is supplied, the signal expansion circuit expands pulse width of the supplied first or second detection signal, and outputs the result as the data transition detection signal.

Therefore, when the input data changes, the first detection signal is generated. When the write control signal changes, the second detection signal is generated. The pulse width of the first or second detection signal is expanded, and it is supplied as data transition detection signal to the data writing circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a timing chart showing writing operation of the SRAM shown in FIG. 1 when the width of an external write enable signal is shorter than that of a data transition detection signal.

FIG. 14 is a timing chart showing writing operation of the SRAM shown in FIG. 1 when the width of the external write enable signal is longer than that of the data transition detection signal.

FIG. 15 is a timing chart showing operation of the SRAM shown in FIG. 1 when there is a noise in the external write enable signal.

DESCRIPTION OF THE PREFERRED EMBODIMENTS

Figure 1:
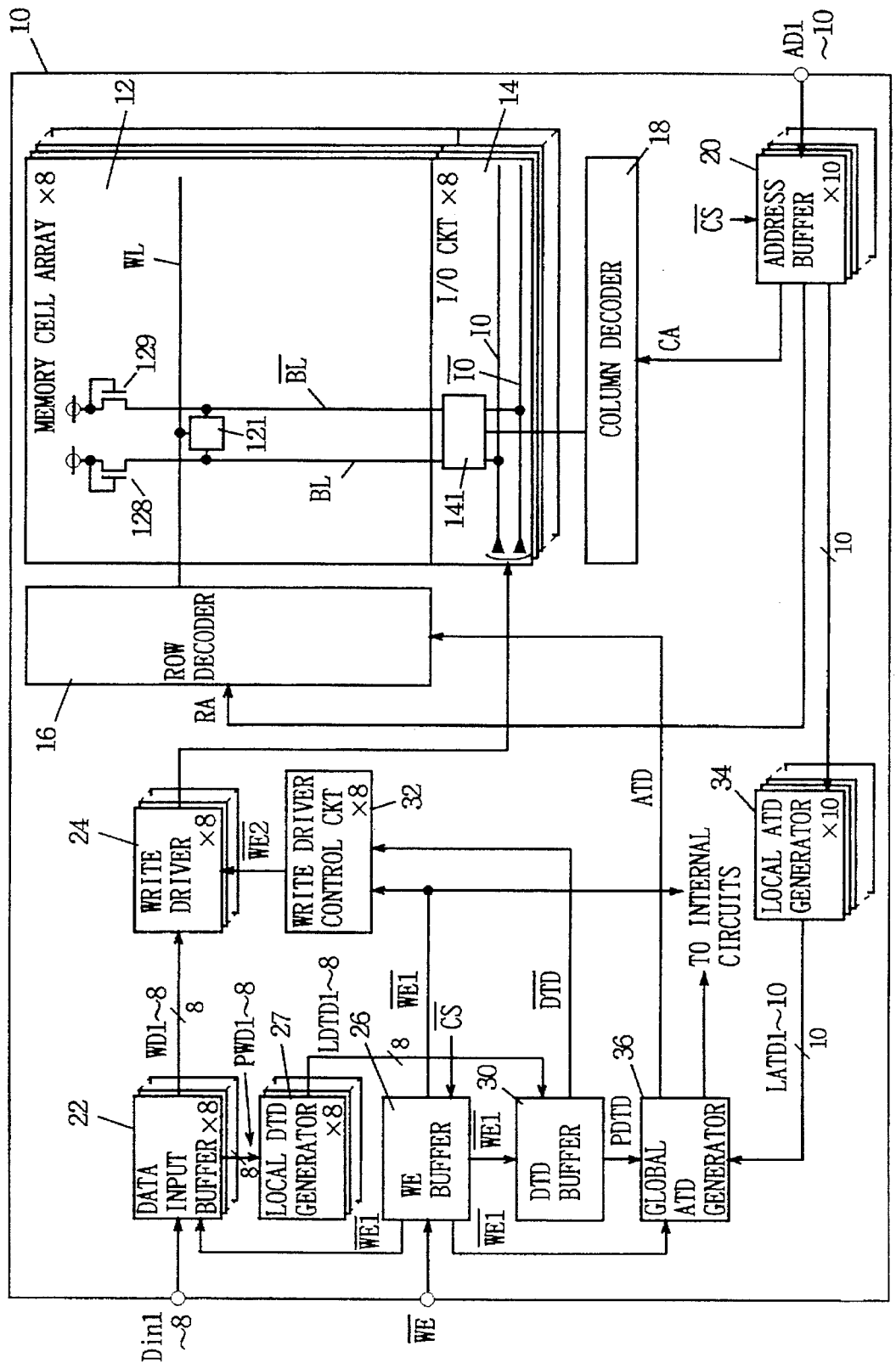
FIG. 1 is a block diagram showing a whole structure of the SRAM in accordance with a first embodiment of the present invention.

Embodiments of the present invention will be described in detail with reference to the figures. Throughout the figures, like reference characters denote the same or like portions.

FIG. 1 is a block diagram showing a whole structure of an SRAM in accordance with a first embodiment of the present invention. Referring to FIG. 1, the SRAM includes, on one semiconductor chip 10, eight memory cell arrays 12, eight input/output circuits 14 corresponding to the memory cell arrays 12, a row decoder 16, a column decoder 18 and ten address buffers 20. Each memory cell array 12 includes a plurality of word lines, a plurality of bit line pairs arranged crossing the word lines, and a plurality of static memory cells arranged corresponding to the crossings of the word lines and bit line pairs. In FIG. 1, only one word line WL, only one bit line pair BL, /BL and only one memory cell 121 are shown. As a bit line load, diode connected N channel MOS transistors 128 and 129 are connected to bit lines BL and /BL, respectively.

Figure 2:
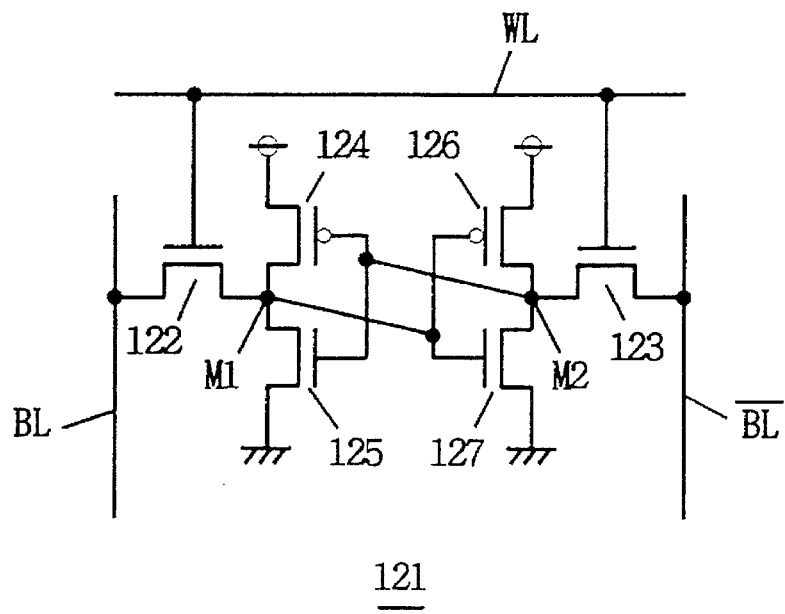
FIG. 2 is a schematic diagram showing a structure of the memory cell shown in FIG. 1.

FIG. 2 is a schematic diagram showing a structure of a memory cell 121 shown in FIG. 1. Referring to FIG. 2, memory cell 121 includes access transistors 122 and 123 formed of N channel MOS transistors, load transistors 124 and 126 formed of P channel MOS transistors, and driver transistors 125 and 127 formed of N channel MOS transistors. Transistors 124 and 125 constitute one CMOS inverter. Transistors 126 and 127 constitute another CMOS inverter. These two inverters are cross coupled between the storage nodes M1 and M2. Access transistor 122 is connected between bit line BL and storage node M1, and has its gate electrode connected to word line WL. Access transistor 123 is connected between bit line /BL and storage node M2, and has its gate electrode connected to word line WL.

In such a memory cell 121, when the potential of the word line WL rises, access transistors 122 and 123 are rendered conductive, whereby the potential of bit line BL is transmitted through access transistor 122 to storage node M1, while the potential of bit line /BL is transmitted through access transistor 123 to storage node M2. Thereafter, when the potential of word line WL lowers, access transistors 122 and 123 are both rendered non-conductive, and therefore, complementary data on bit line pair BL, /BL come to be latched by the cross coupled two inverters. Since memory cell 121 has bi-stable state, refreshing operation is not necessary.

Though a full CMOS type memory cell 121 is shown as an example, a high resistance load type memory cell, a TFT type memory cell or the like may be used in stead of the memory cell 121 of this type.

Again, referring to FIG. 1, each input/output circuit 14 includes a plurality of column selection gates corresponding to a plurality of bit line pairs, and input/output line pair IO, /IO. In FIG. 1, only one column selection gate 141 is shown as a representative.

Figure 3:
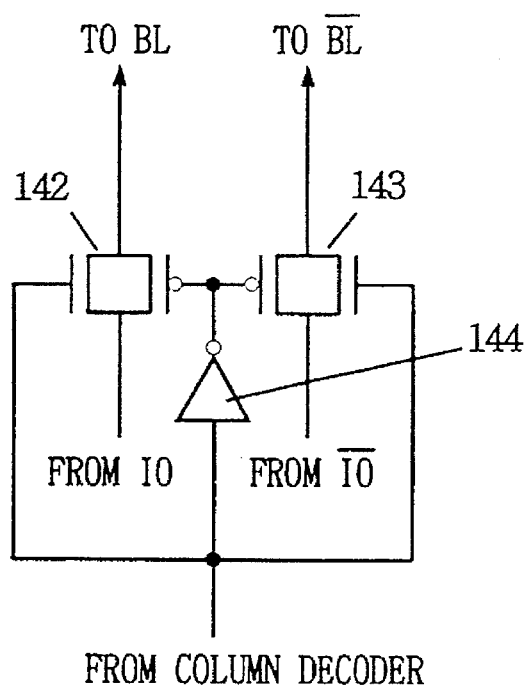
FIG. 3 is a schematic diagram showing a structure of a column selection gate shown in FIG. 1.

FIG. 3 is a schematic diagram showing a structure of the column selection gate 141 shown in FIG. 1. Referring to FIG. 3, column selection gate 141 includes transfer gates 142 and 143, and an inverter 144. Transfer gate 142 is constituted by an N channel MOS transistor and a P channel MOS transistor, and connected between input/output line IO and bit line BL. Transfer gate 143 is constituted by an N channel MOS transistor and a P channel MOS transistor, and connected between input/output line /IO and bit line /BL. To the gate electrodes of N channel MOS transistors in transfer gates 142 and 143, a column selection signal from column decoder 18 shown in FIG. 1 is supplied. To the gate electrodes of P channel MOS transistors of transfer gates 142 and 143, a column selection signal from column decoder 18 is supplied through inverter 144.

Therefore, when a column selection signal at an H (logic high) level is supplied, transfer gates 142 and 143 are rendered conductive, data of input/output line IO is transmitted thorough transfer gate 142 to bit line BL, and data of input/output line /IO is transferred through transfer gate 143 to bit line /BL.

Again, referring to FIG. 1, row decoder 16 decodes a row address signal RA supplied from address buffer 20, and accordingly selects one word line WL. When the word line WL is selected, potential thereof rises, and access transistors 122 and 123 of all the memory cells 121 connected to the word line WL are rendered conductive, as already described. Row decoder 16 operates also in response to an address transition detection signal ATD from a global ATD generator 36, which will be described later.

Column decoder 18 decodes a column address CA supplied from address buffer 20, and accordingly selects one bit line pair BL, /BL. To the selected bit line pair BL, /BL, data of input/output line pair IO, /IO are supplied through column selection gate 141, as already described.

All address buffers 20 are activated in response to a chip select signal /CS, and amplify 10 bits of address signals AD1 to AD10 which are externally applied, apply row address signal RA to row decoder 16 and apply column address signal CA to column decoder 18.

Figure 4:
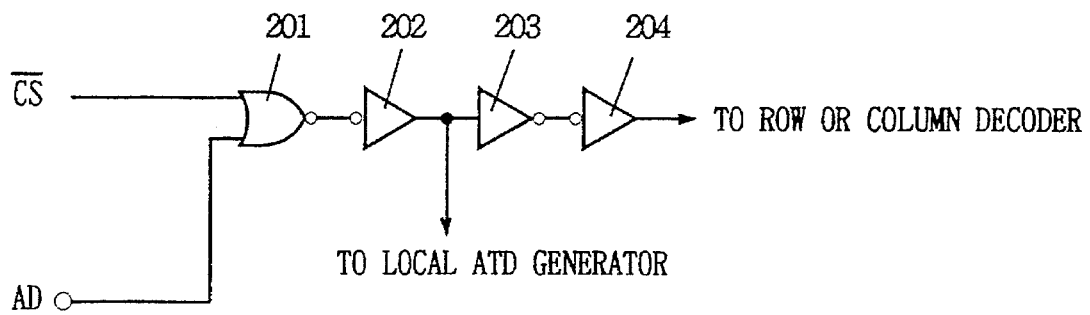
FIG. 4 is a schematic diagram showing a structure of an address buffer shown in FIG. 1.

FIG. 4 is a schematic diagram showing a structure of each address buffer 20 shown in FIG. 1. Referring to FIG. 4, each address buffer 20 includes an NOR gate 201 and inverters 202 to 204. The chip select signal /CS and 1 bit of address signal AD are supplied to NOR gate 201. And output from NOR gate 201 is supplied to row decoder 16 or column decoder 18 through inverters 202 to 204. An output from inverter 202 is supplied to a local ATD generator 34, which will be described later. Therefore, when an L (logic low) level chip select signal /CS is supplied, each address buffer 20 supplies externally applied address signal AD to row decoder 16 or column decoder 18.

Again, referring to FIG. 1, the SRAM further includes eight data input buffers 22, eight write drivers 24 and write enable buffer 26.

Figure 5:
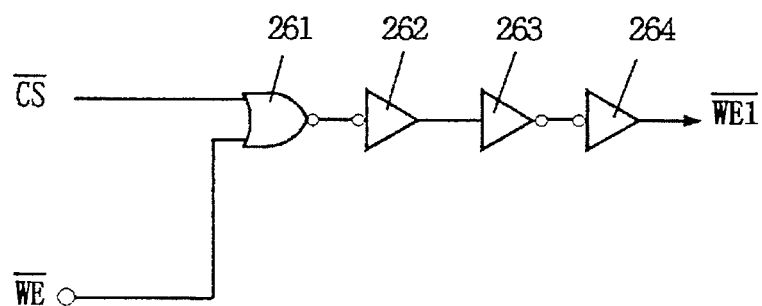
FIG. 5 is a schematic diagram showing a structure of a write enable buffer shown in FIG. 1.

FIG. 5 is a schematic diagram showing a structure of write enable buffer 26. Referring to FIG. 5, write enable buffer 26 includes an NOR gate 261 and inverters 262 to 264. To NOR gate 261, a chip select signal /CS and external write enable signal /WE are supplied. An output from NOR gate 261 is supplied through inverters 262 to 264 to data input buffer 22 of FIG. 1 and so on, as an internal write enable signal /WE1. Therefore, when an L level external write enable signal /WE is supplied while the chip select signal /CS is at the L level, write enable buffer 26 generates an L level internal write enable signal /WE1.

Figure 6:
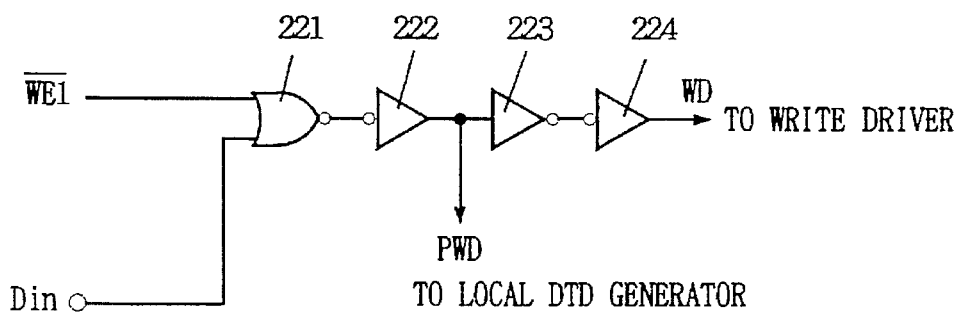
FIG. 6 is a schematic diagram showing a structure of a data input buffer shown in FIG. 1.

FIG. 6 is a schematic diagram showing a structure of each data input buffer 22 shown in FIG. 1. Referring to FIG. 6, data input buffer 22 includes; an NOR gate 221 and inverters 222 to 224. To NOR gate 221, the internal write enable signal /WE1 from write enable buffer 26 is supplied, and in addition, corresponding one bit of input data Din out of eight bits of external input data Din1 to Din8 is supplied. An output from NOR gate 221 is supplied through inverters 222 to 224 to corresponding one write driver 24, as write data WD. An output from inverter 222 is supplied as write data PWD to corresponding one of eight local DTD generators 27 which will be described later. Therefore, while internal write enable signal /WE1 is at the L level, these eight data input buffers 22 supply eternally applied 8 bits of input data Din1 to Din8 as write data WD1 to WD8 to eight write drivers 24, respectively, and supply these as write data PWD1 to PWD8 to eight local DTD generators 27.

Again referring to FIG. 1, the SRAM further includes eight local DTD generators 27 and a DTD buffer 30. Each of the local DTD generators 27 generates, when the supplied 1 bit of write data PWD changes, 1 bit of local data transition detection signal LDTD. DTD buffer 30 generates, when any of the supplied 8 bits of local data transition detection signal LDTD1 to LDTD8 changes, 1 bit of data transition detection signal /DTD. DTD buffer 30 also generates the data transition detection signal /DTD when the supplied internal write enable signal /WE1 changes.

Figure 7:
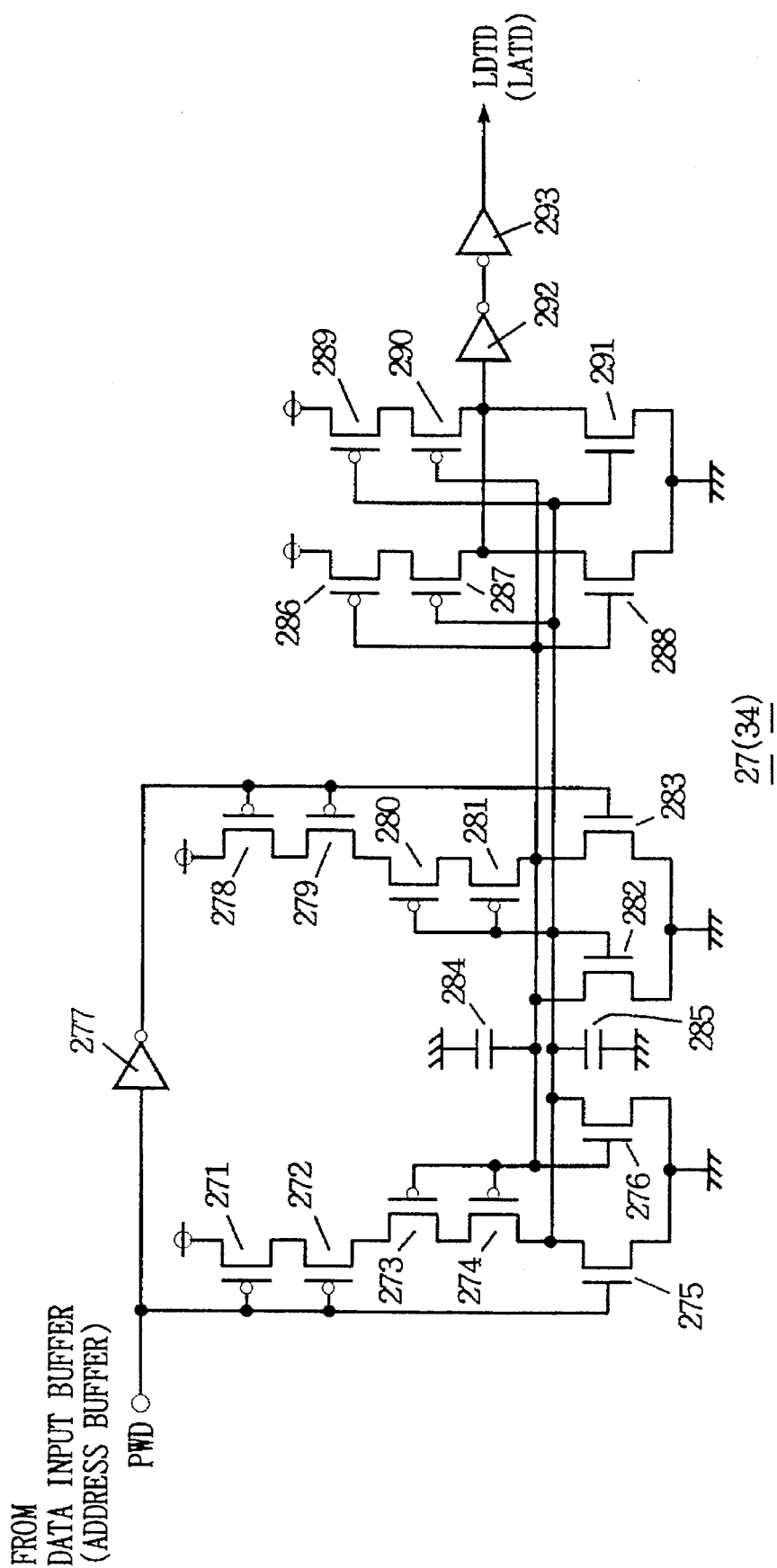
FIG. 7 is a schematic diagram showing a structure of a local DTD generator or a local ATD generator shown in FIG. 1.

FIG. 7 is a schematic diagram showing a structure of each local DTD generators 27 shown it. FIG. 1. Referring to FIG. 7, local DTD generators 27 includes P channel MOS transistors 271 to 274 connected in series and N channel MOS transistors 275 and 276 connected in parallel. Local DTD generator further includes an inverter 277, P channel MOS transistors 278 to 281 connected in series, and N channel MOS transistors 282 and 283 connected in parallel. Local DTD generator 27 further includes capacitors 284 and 285 for determining pulse width of the local data transition detection signal LDTD to be generated.

Local DTD generager 27 further includes P channel MOS transistors 286 and 287 and an N channel MOS transistor 288 connected in series. Local DTD generator 27 further includes P channel MOS transistors 289 and 290 and an N channel MOS transistor 291 connected in series. Local DTD generator 27 further includes inverters 292 and 293.

Figure 8:
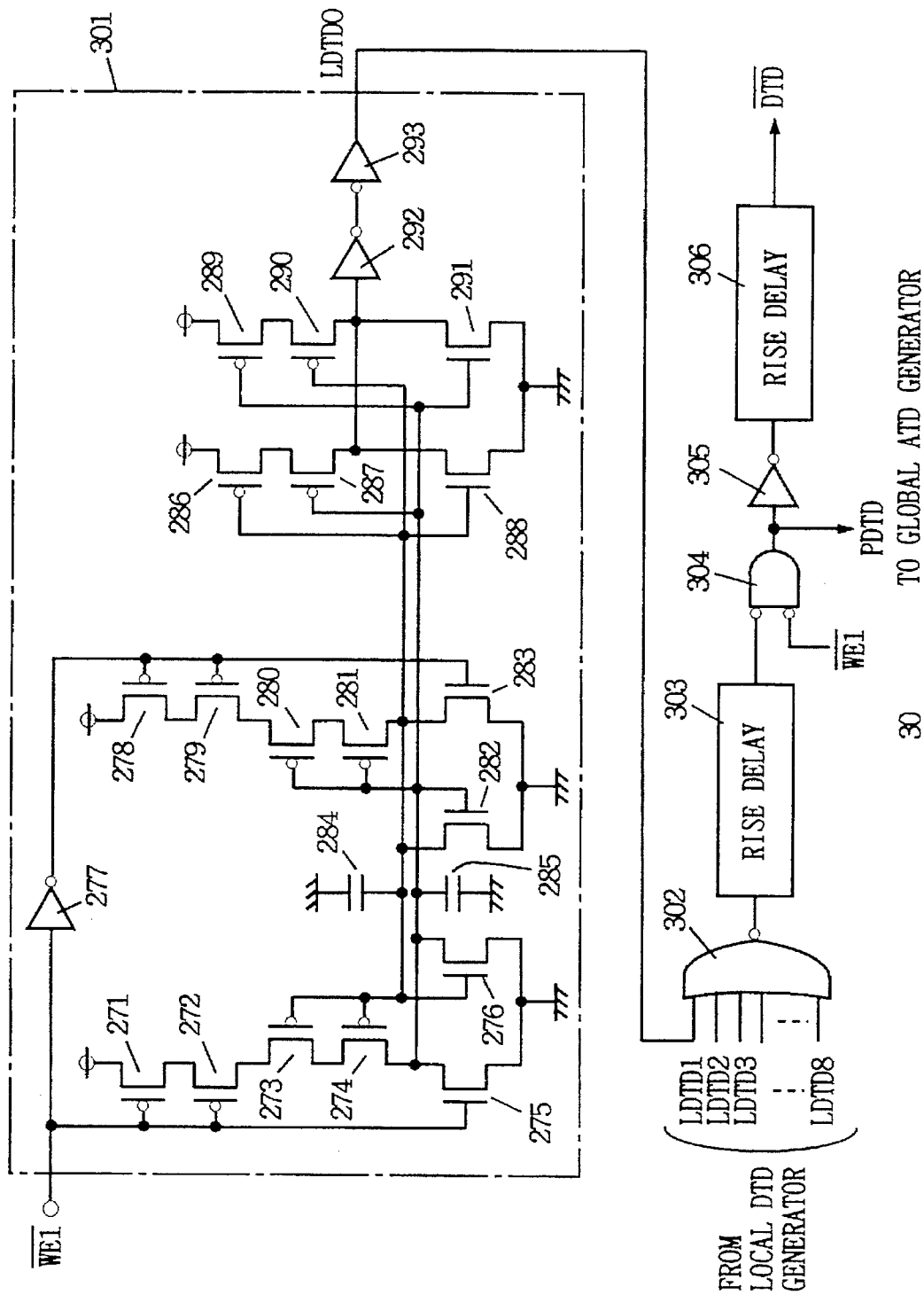
FIG. 8 is a schematic diagram showing a structure of the DTD buffer shown in FIG. 1.

FIG. 8 is block diagram showing a structure of the DTD buffer 30 shown in FIG. 1. Referring to FIG. 8, DTD buffer 30 includes a write enable transition detector 301, a 9-input NOR gate 302, a rise delay circuit 303, a logic gate 304, an inverter 305 and a rise delay circuit 306.

Write enable transition detector 301 is structured in a similar manner as the local DTD generator 27 shown in FIG. 7. Therefore, when internal write enable signal /WE1 changes, write enable transition detector 301 generates a transition detection signal LDTD0. To NOR gate 302 transition detection signal LDTD0 from write enable transition detector 301 is supplied, and 8 bits of local data transition detection signals LDTD1 to LDTD8 from local DTD generator 27 are supplied. An output from NOR gate 302 is supplied to rise delay circuit 303.

Figure 9:
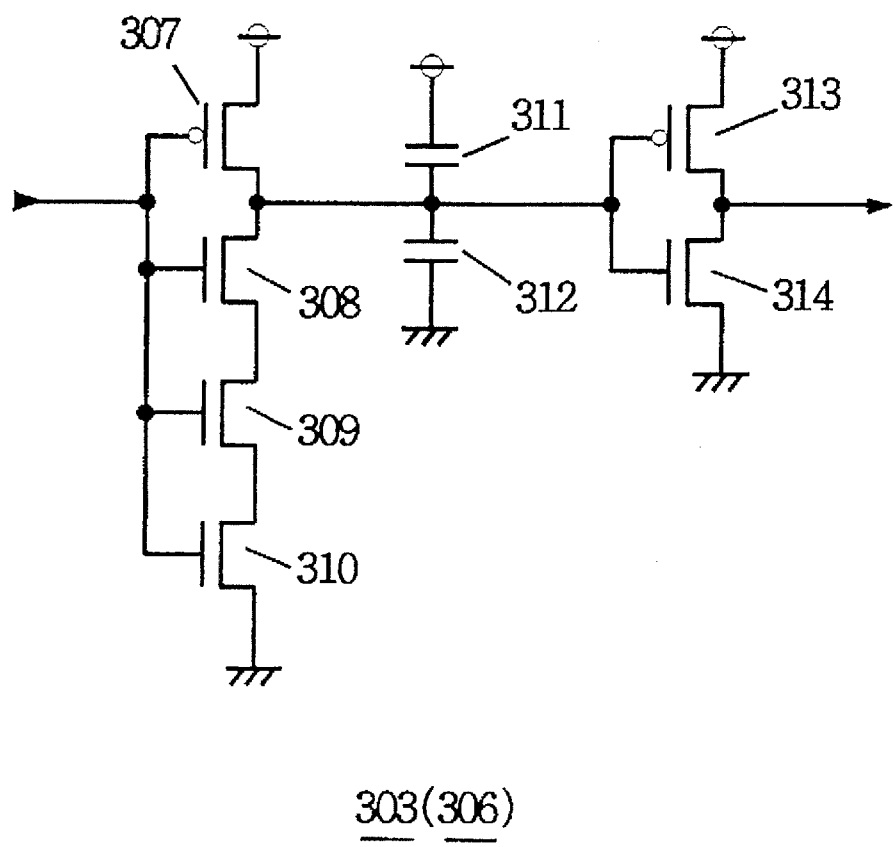
FIG. 9 is a schematic diagram showing a structure of a rise delay circuit shown in FIG. 8.

FIG. 9 is a schematic diagram showing a structure of rise delay circuit 303 shown in FIG. 8. Referring to FIG. 9, rise delay circuit 303 includes P channel MOS transistor 307 and N channel MOS transistors 308 to 310 connected in series, capacitors 311 and 312, and a P channel MOS transistor 313 and an N channel MOS transistor 314 connected in series. Transistors 307 to 310 constitute one CMOS inverter. Transistors 313 and 314 constitute another CMOS inverter. Capacitor 311 is connected between an output of an inverter of the preceding stage and a power supply node. Capacitor 312 is connected between an output node of an inverter of the preceding stage and the ground node.

In the inverter of the preceding stage, three N channel MOS transistors 308 to 310 are connected in series, and therefore channel length thereof is substantially made longer. Therefore, drivability of the transistors 308 to 310 as a whole becomes smaller than that of P channel MOS transistor 307. Consequently, when an L level input signal is applied, capacitor 311 is discharged quickly, and capacitor 312 is charged quickly. However, when an H level input signal is supplied, capacitor 311 is charged gradually, and capacitor 312 is discharged gradually. Therefore, rise delay circuit 303 can provide delay only at the rise of input signal.

Referring again to FIG. 8, to logic gate 304, an output from rise delay circuit 303 is applied, and the internal write enable signal /WE1 from write enable buffer 26 is applied. The output from logic gate 304 is supplied to rise delay circuit 306 through inverter 305 and to global ATD generator 36, which will be described later, as data transition detection signal PDTD. Rise delay circuit 306 has a similar structure as the rise delay circuit 303 shown in FIG. 9.

Figure 10:
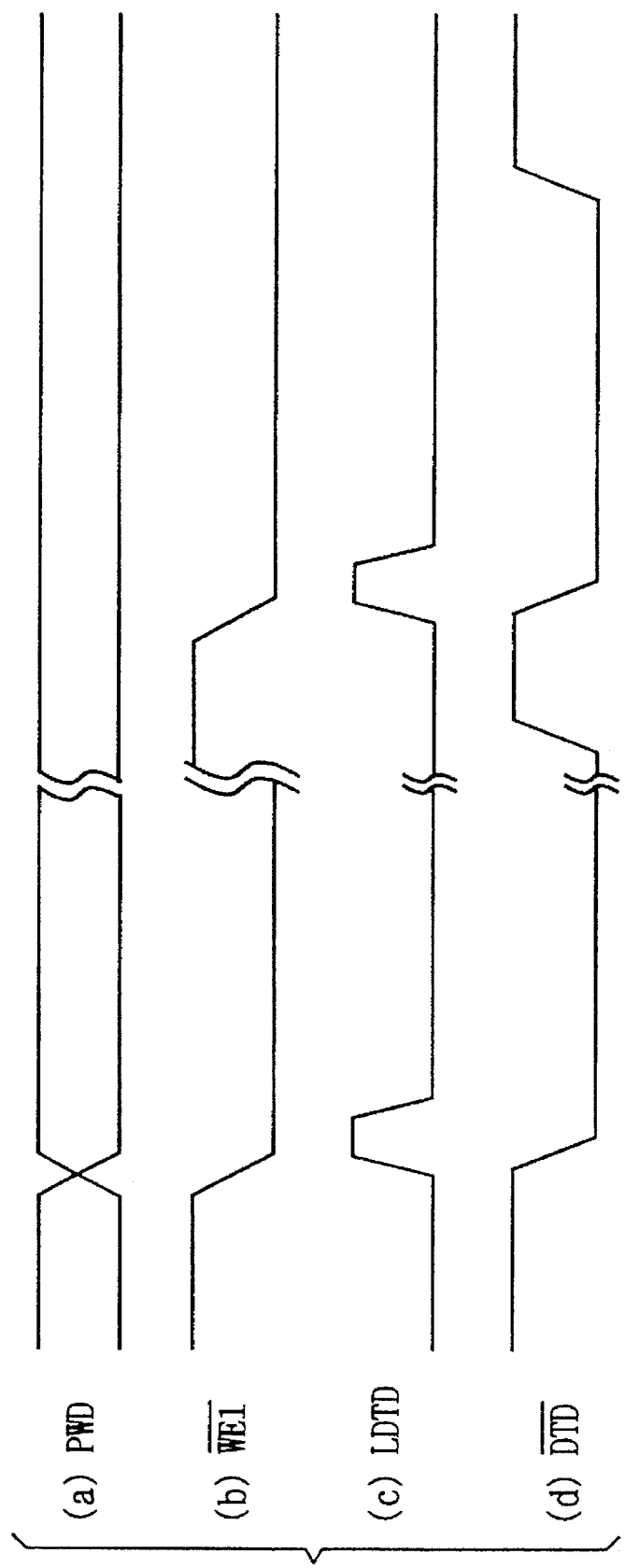
FIG. 10 is a timing chart showing operations of the local DTD generator and of the DTD buffer shown in FIG. 1.

FIG. 10 is a timing chart showing the operations of local DTD generator 27 and of DTD buffer 30. As shown in FIG. 10(a), when write data PWD supplied from one data input buffer 22 changes, corresponding local data transition detection signal LDTD attains to and kept at the H level for a prescribed time period, as shown in FIG. 10(c). In this manner, when any one focal data transition detection signal LDTD attains to the H level, data transition detection signal /DTD attains to and kept at the L level for a prescribed time period, as shown in FIG. 10(d).

When the internal write enable signal /WE1 supplied from write enable buffer 26 changes from the H level to the L level as shown in FIG. 10(b), the transition detection signal LDTD in DTD buffer 30 attains to and kept at the H level for a prescribed time period as shown in FIG. 10 (c). When transition detection signal LDTD attains to the H level, data transition detection signal /DTD attains to and kept at the L level for a prescribed time period as shown in FIG. 10(b).

In this manner, when input data Din1 to Din8 changes, in other words, when any 1 bit input data Din changes, data transition detection signal /DTD of L level is generated for a prescribed time period. When external write enable signal /WE changes from the H level to the L level, the data transition detection signal /DTD of the L level is also generated for a prescribe time period.

Figure 11:
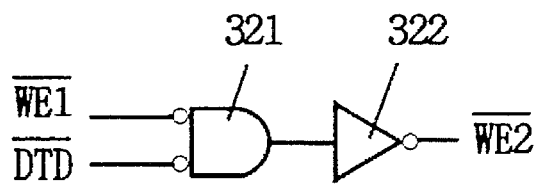
FIG. 11 is a schematic diagram showing a structure of a write driver control circuit shown in FIG. 1.

FIG. 11 is a schematic diagram showing a structure of write driver control circuit 32 shown in FIG. 1. Referring to FIG. 11, write driver control circuit 32 includes a logic gate 321 and an inverter 322. To logic gate 321, the internal write enable signal /WE1 from write enable buffer 26 and data transition detection signal /DTD from DTD buffer 30 are supplied. An output from logic gate 321 is supplied as internal write enable signal /WE2 to eight write drivers 24 through inverter 322.

Figure 12:
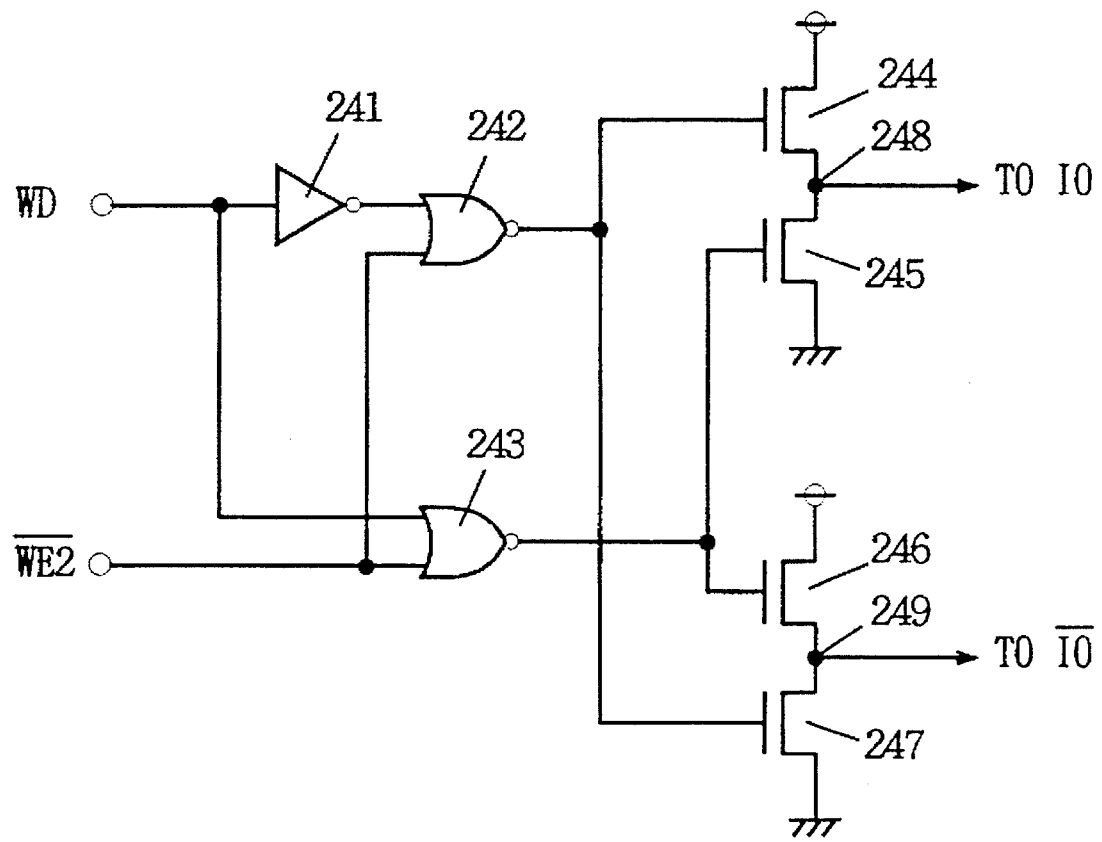
FIG. 12 is a schematic diagram showing a structure of a write driver shown in FIG. 1.

FIG. 12 is a schematic diagram snowing a structure of each write driver 24 shown in FIG. 1. Referring to FIG. 12, write driver 24 includes an inverter 241, NOR gates 242 and 243, and N channel MOS transistors 244 to 247. To NOR gate 242, write data WD from corresponding one data input buffer 22 is supplied through inverter 241, and in addition, an internal write enable signal /WE2 from write driver control circuit 32 is supplied. To NOR gate 243, the write data WD and the internal write enable signal /WE2 are supplied.

Transistors 244 and 243 are connected in series between the power supply node and the ground node, and output node 248 is connected to input/output line IO of the corresponding input/output circuit 14 shown in FIG. 1. Transistors 246 and 247 are connected in series between the power supply node and the ground node, and the output node 249 is connected to input/output line/IO of the input/output circuit 14. The output from NOR gate 242 is applied to gate electrodes of transistors 244 and 247. The output from NOR gate 243 is applied to gate electrodes of transistors 245 and 246.

When an internal write enable signal /WE2 at the H level is supplied, a potential at the L level is applied to the gate electrodes of all of the transistors 244 to 247. Therefore, all the transistors 244 to 247 are rendered non-conductive, and hence output nodes 248 and 249 both attain to the high impedance state.

Meanwhile, when the internal write enable signal /WE2 at the L level is supplied, the write driver 24 is activated. When write data WD at the H level is supplied, transistors 244 and 247 are rendered conductive, and transistors 245 and 246 are rendered non-conductive. Therefore, the potential at output noble 248 attains to the H level, and the potential at output node 249 attains to the L level.

Meanwhile, when write data WD at the L level is supplied, transistors 244 and 247 are rendered non-conductive, and transistors 245 and 246 are rendered conductive. Therefore, the potential at the output node 248 attains to the L level and the potential at the output node 249 attains to the H level.

In this manner, while the internal write enable signal /WE2 is at the H level, the supplied write data WD is amplified and supplied to input/output line pair IO, /IO.

Again referring to FIG. 1, the SRAM includes ten local ATD generators 34 corresponding to address buffers 20, and a global ATD generator 36. Each local ATD generator 34 has the same structure as local DTD generator 27 shown in FIG. 7. Therefore, when the corresponding 1 bit of address signal changes, each local ATD generator 34 generates a local address transition detection signal LATD at the H level. When any of the local address transition detection signals LATD1 to LATD 10 supplied from local ATD generator 34 attains to the H level, global ATD generator 36 generates an address transition detection signal ATD. Therefore, when externally applied address signals AD1 to AD10 changes, the address transition detection signal ATD attains to and kept at the H level for a prescribed time period.

The operation of the above described SRAM is as follows.

FIG. 13 is a timing chart showing writing operation when the pulse width of the external write enable signal /WE is shorter than that of the data transition detection signal. As shown in FIG. 13(b), when external write enable signal /WE changes from the H level to the L level, the data transition detection signal /DTD from DTD buffer 30 attains to and kept at the L level for a prescribed time period, as shown in FIG. 13(d). In this example, before the data transition detection signal /DTD returns to the H level, the external write enable signal /WE returns from the L level to the H level.

Since data input buffer 22 is activated in response to the internal write enable signal /WE1 at the L level, the input data Din is supplied as write data WD to write driver 24 as shown in FIG. 13(c) only while the external write enable signal /WE is at the L level.

The internal write enable signal /WE2 for activating write driver 24 attains to the L level when internal write enable signal /WE1 and data transition detection signal /DTD are both at the L level as shown in FIG. 13(e). Here, the pulse width of data transition detection signal /DTD is wider than that of external write enable signal /WE, and therefore in response to the fall of external write enable signal /WE, internal write enable signal /WE2 falls and in response to the rise of external write enable signal /WE, internal write enable /WE2 also rises. Therefore, write data WD is supplied to input/output line pair IO, /IO only while the internal write enable signal /WE2 is at the L level. The supplied write data WD is transferred through column selection gate 141 to bit line pair BL, /BL. Therefore, as shown in FIG. 13(g), potential of one of the bit line pair BL, /BL attains to the H level and the potential of the other attains to the L level.

Further, as shown in FIG. 13(f), when a prescribe time period passes from the fall of data transition detection signal /DTD, the potential of selected word line WL rises. Therefore, access transistors 122 and 123 of all the memory cells 121 connected to the selected word line are rendered conductive, and hence the data on the bit line pair BL, /BL is written to memory cell 121.

FIG. 14 is a timing chart showing writing operation when the pulse width of external write enable signal is wider than that of data transition detection signal. Similar to the example above, when external write enable signal /WE changes from the H level to the L level as shown in FIG. 14(b), the data transition detection signal /DTD attains to the L level as shown in FIG. 14(d). Since the data input buffer 22 is activated while internal write enable signal /WE1 at the L level, the supplied input data Din is applied to write driver 24 as write data WD as shown in FIG. 14(c), while the external write enable signal /WE is at the L level as shown in FIG. 14(b). Here, data transition detection signal /DTD returns to the L level before the external write enable signal /WE returns to the H level. Therefore, as shown in FIG. 14(e), in response to the fall of data transition detection signal /DTD, internal write enable signal /WE2 falls, and in response to the rise of data transition detection signal /DTD, internal write enable signal /WE2 rises. Since write driver 24 is activated only while the internal write enable signal /WE2 is at the L level, the supplied write data WE are supplied to bit line pair BL, /BL through input/output line pair IO, /IO and column selection gate 141 only while the data transition detection signal /DTD is at the L level. Therefore, as shown in FIG. 14(g), potential of one of the bit line pair BL, /BL attains to the H level and the potential of the other attains to the L level.

Further, as shown in FIG. 14(f), when a prescribed time period has passed after the fall of data transition detection signal /DTD, the potential of the selected word line WL rises, and data of bit line pair BL, /BL are written to all the memory cells MC which are connected to the word line.

Here, if the internal write enable signal /WE1 is directly supplied to write driver 24, write driver would be kept active continuously while the external write enable signal /WE is at the L level, and write data WD would be written to the corresponding memory 121. Accordingly, though data writing has been completed in a prescribed time period from the fall of the external write enable signal /WE, the data would be continuously written. This may possibly lead to the flow of large amount of current from bit lines 128 and 129 to bit line pair Bl, /BL.

However, in this embodiment, when the pulse width of external write enable signal WE is wider than that of data transition detection signal /DTD, write driver 24 is activated in response to data transition detection signal /DTD. When data transition detection signal /DTD rises, writing of data is completed, and hence write current flowing from bit line loads 128 and 129 to bit lines BL and /BL, and operational current flowing through write driver 24 and sense amplifiers can be reduced.

FIG. 15 is a timing chart showing an operation when there is a noise in the external write enable signal during reading. As shown in FIG. 15(b), SRAM is at the reading state, and therefore external write enable signal /WE is at the H level. When there is a noise in the external write enable signal /WE of H level, data input buffer 22 is activated in a moment, and write data WD is temporarily supplied to write driver 24 as shown in FIG. 15(C). When there is generated a noise in write enable signal WE at the H level, the data transition detection signal /DTD attains to and kept at the L level as shown in FIG. 15(d). Further, when a prescribed time period lapses from the fall of the data transition detection signal /DTD as described above, the potential of selected word line rises as shown in FIG. 15(e).

In this embodiment, since write driver 24 is activated when the internal write enable signal /WE1 and data transition detection signal /DTD are both at the L level, there is not a possibility that erroneous write data WD is written to memory cell 121 because of the noise.

If the data transition detection signal /DTD were directly supplied to write driver 24, data transition detection signal /DTD would attain to and kept at the L level when there is a noise in external write enable signal /WE. Therefore, the write data WD would be supplied continuously to the corresponding bit line pair BL, /BL while the data transition detection signal /DTD is at the L level, increasing the possibility of erroneous writing.

However, the write driver 24 is activated only when the internal write enable signal /WE1 and data transition detection signal /DTD are both at the L level, erroneous writing is not possibly caused simply by an instantaneous noise in the external write enable signal /WE.

As described above, according to the present embodiment, when external write enable signal /WE is kept at the L level for a long period, input data is written to the memory cell only while the data transition detection signal /DTD is at the L level, and hence power consumption can be reduced. Further, even when data transition detection signal /DTD attains to and kept at the L level because of a noise in external write enable signal WE, there is not a possibility of erroneous writing, since write driver 24 is activated only when the external write enable signal and the data transition detection signal /DTD are both at the L level. Therefore, the SRAM in accordance with the present embodiment has small power consumption and hardly any possibility of erroneous writing.

Though an embodiment of the present invention has been described in detail, the scope of the present invention is not limited by the embodiment described above. For example, in the above description, the present invention has been applied to an SRAM having x8 structure. However, the number of memory cell arrays or the like are not limited. It is also possible to apply the present invention to a dynamic random access memory (DRAM).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising,
    a memory cell;
    signal generating means responsive to transition of an eternally applied input data or to an externally supplied write enable signal for generating a data transition detection signal for a prescribed time period;
    cell when only both of said write enable signal and said data transition detection signal are activated.

2. The semiconductor memory device according to claim 1, wherein
    said data writing means includes
        control means for generating a prescribed activating signal when both of said write enable signal and said data transition detection signal are activated, and
        write driver means responsive to said activating signal from said control means for supplying said input data to said memory cell.

3. The semiconductor memory device according to claim 2, wherein
    said control means includes an AND circuit responsive to said write enable signal and said data transition detection signal for supplying said activating signal.

4. The semiconductor memory device according to claim 1, wherein
    said signal generating means includes
        first transition detection means for detecting transition of said input data and generating a first detection signal,
        second transition detection means for detecting transition of said write enable signal and generating a second detection signal,
        signal expanding means for expanding, when either one of said first and second detection signals is supplied from either one of said first and second transition detection means, pulse width of the supplied detection signal and supplying the supplied detection signal with expanded pulse width as said data transition detection signal.

5. A semiconductor memory device, comprising:
    a memory cell array including
        (a) a plurality of word lines,
        (b) a plurality of bit line pairs crossing said plurality of word lines, and
        (c) a plurality of memory cells corresponding to crossings of said word lines and said bit line pairs and each connected to the
        (c) a plurality of memory cells corresponding to crossings of said word lines and said bit line pairs and each connected to the corresponding word line and corresponding bit line pair;
    row selecting means responsive to an externally applied row address signal for selecting any of said word lines;
    column selecting means responsive to an externally applied column address signal for selecting any of said bit line pairs;

signal generating means responsive to transition of an externally supplied input data or to transition of an externally supplied write enable signal for generating a data transition detection signal for a prescribed time period; and data supplying means for supplying, when only both of said write enable signal and said data transition detection signal are activated, said input data to the bit line pair selected by said column selecting means.

6. The semiconductor memory device according to claim 5, wherein said data supplying means includes control means for generating a prescribed activating signal when both of said write enable signal and said data transition detection signal are activated, and write driver means responsive to said activating signal from said control means for supplying said input data to said selected bit line pair.

7. The semiconductor memory device according to claim 6, wherein said control means includes an AND circuit responsive to said write enable signal and said data transition detection signal for supplying said activating signal.

8. The semiconductor memory device according to claim 5, wherein said signal generating means includes first transition detection means for detecting transition of said input data and generating a first detection signal, second transition detection means for detecting transition of said write enable signal and generating a second detection signal, signal expanding means for expanding, when either one of said first and second detection signals is supplied from either one of said first and second transition detection means, pulse width of the supplied detection signal and supplying the supplied detection signal with expanded pulse width as said data transition detection signal.

* * * * *